US009521342B2

(12) United States Patent
Mesgarani

(10) Patent No.: US 9,521,342 B2
(45) Date of Patent: Dec. 13, 2016

(54) AMPLIFIER SHARING TECHNIQUE FOR LOW POWER CHARGE MODE READOUT IN CMOS IMAGE SENSORS

(71) Applicant: Forza Silicon Corporation, Pasadena, CA (US)

(72) Inventor: Ali Mesgarani, Pasadena, CA (US)

(73) Assignee: Forza Silicon, Inc., Pasadena, CA (US)

( * ) Notice: Subject to any disclaimer, the term of this patent is extended or adjusted under 35 U.S.C. 154(b) by 0 days.

(21) Appl. No.: 14/875,588

(22) Filed: Oct. 5, 2015

(65) Prior Publication Data

US 2016/0100116 A1    Apr. 7, 2016

Related U.S. Application Data

(60) Provisional application No. 62/059,844, filed on Oct. 3, 2014.

(51) Int. Cl.
*H04N 5/378* (2011.01)
*H04N 5/369* (2011.01)
*H04N 5/3745* (2011.01)
*H03F 3/45* (2006.01)

(52) U.S. Cl.
CPC ........ *H04N 5/3745* (2013.01); *H03F 3/45475* (2013.01); *H04N 5/3698* (2013.01); *H04N 5/378* (2013.01); *H03F 2203/45171* (2013.01); *H03F 2203/45514* (2013.01)

(58) Field of Classification Search
CPC .... H04N 5/3745; H04N 5/378; H04N 5/3698; H03F 3/45475; H03F 2203/45514; H03F 2203/45171
USPC ........ 348/272, 294, 314, 324, 302, 572–573
See application file for complete search history.

(56) References Cited

U.S. PATENT DOCUMENTS

| 8,130,125 B2* | 3/2012 | Hoshino | H03M 1/0607 341/122 |
| 8,760,213 B2* | 6/2014 | Saito | H03K 3/0231 327/406 |
| 2009/0079603 A1* | 3/2009 | Maruyama | H03K 4/502 341/122 |
| 2009/0179699 A1* | 7/2009 | Higuchi | H03F 3/005 330/260 |

OTHER PUBLICATIONS

Nagaraj et al: "A 250-mW, 8-B, 52-Msamples/s Parallel-Pipelined A/D Converter with Reduced Number of Amplifiers," IEEE Journal of Solid-State Circuits, pp. 312-320, Mar. 1997.

* cited by examiner

*Primary Examiner* — Hung Lam
(74) *Attorney, Agent, or Firm* — Mountain IP, pLLC

(57) ABSTRACT

Presented herein are novel shared amplifier charge mode readout architectures for image sensors, for example, configured to process a pair of signals comprising photointegration and reset signals from a pixel. The invention encompasses a novel 2-channel configuration wherein a single amplifier can serve the two channels in alternating phases. In the first phase, a selected pair of signals from the first channel is read out to an ADC using the amplifier while the readout components of the second channel are reset. In the second phase, a selected pair of signals from the second channel is read out an ADC using the amplifier while the readout components of the first channel are reset. This alternating arrangement allows a single amplifier to be shared between two readout channels. Level shifting may be included in the signal pathway to modulate output swing and other signal parameters.

8 Claims, 3 Drawing Sheets

AMPLIFIER SHARING TECHNIQUE FOR LOW POWER CHARGE MODE READOUT IN CMOS IMAGE SENSORS

CROSS-REFERENCE TO RELATED APPLICATIONS

This application claims the benefit of priority to U.S. Provisional Application Ser. No. 62/059,844, entitled "Amplifier Sharing Technique for Low Power Charge Mode Readout in CMOS Image Sensors," filed Oct. 3, 2014, the contents of which are hereby incorporated by reference.

STATEMENT REGARDING FEDERALLY SPONSORED RESEARCH OR DEVELOPMENT

Not applicable.

REFERENCE TO SEQUENCE LISTING, A TABLE, OR A COMPUTER PROGRAM LISTING COMPACT DISK APPENDIX

Not Applicable.

BACKGROUND AND SUMMARY OF THE INVENTION

Charge Mode Readout (CMR) is one of the key building blocks of CMOS image sensor readout circuitry. They are used to perform correlated double sampling (CDS) in a CMOS image sensor by subtracting signal and reset voltages of CMOS active pixels. They can also be configured to convert single ended signal and reset voltages of a CMOS image sensor into a fully differential output signal by adding proper offset voltage to the signal and reset values.

The individual pixels in a selected CMOS image sensor pixel array row are simultaneously read out through individual columns readout circuitry to a line memory, where they are stored on sample-and-hold capacitors. Each pixel output comprises two signals: first, a "Sample" or photointegration signal which is proportional to the integrated photon flux captured by the photodiode during each integration period; and second, a "Reset" signal, which is a voltage level at which the pixel was held before the photon charge integration starts. Upon column readout, these stored signals are routed to a switched capacitor amplifier known as charge mode readout amplifier. The number of charge mode readout amplifiers required for reading out sampled pixel values is determined by the readout speed. The resulting voltage signal is input to an analog-to-digital converter ("ADC") for conversion to a digital signal representing the differential between Sample signal and the Reset signal.

In typical CMR designs, signals from multiple columns are sequentially fed into a single readout channel. In this way, a single amplifier, ADC, and associated circuitry can serve multiple columns, making efficient use of power and area. However, high-performance amplifiers are usually required in CMR's due to their poor feedback factor and high speed requirements, which increases the image sensor readout power usage drastically. In fact, the CMR amplifiers have become one of the most power-hungry components in today's CMOS image sensors.

Accordingly, there is a need in the art for solutions, which will reduce the power consumed in reading out each column. Presented herein are novel circuits and associated methods that reduce power consumption while retaining the advantages of CMR readout. The invention encompasses the use of a shared amplifier for alternating stages readout that can process two channel's worth of columns, doubling the number of columns served by a single amplifier and significantly reducing the power utilized in reading out each column.

DESCRIPTION OF THE INVENTION

Figure 1:
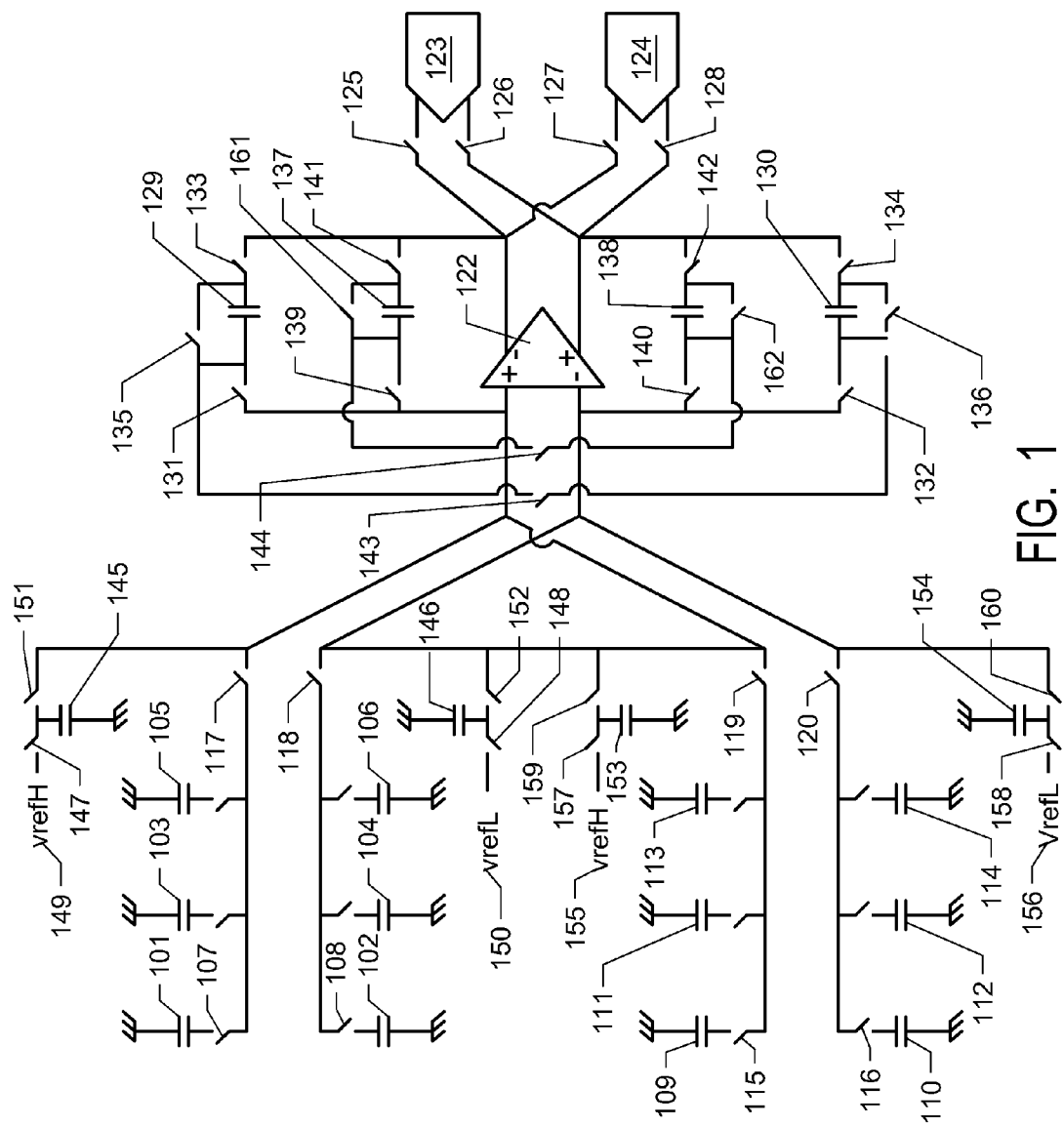
FIG. 1 depicts an exemplary charge mode readout system of the invention. Two separate channels are present, each channel comprising multiple pairs of sample and hold capacitors, a pair of feedback capacitors, and an analog to digital converter. The channels are arranged such that they can be alternately placed in an on-line and off-line mode. In the on-line read mode, one selected pair of sample and hold capacitors from one channel is connected to the amplifier and read to the ADC dedicated to that channel. In the off-line mode, the readout components of the previously read channel are disconnected from the amplifier and reset while a selected pair of sample and hold capacitors from the other channel is read. The circuit further includes level shifting capacitors which can be charged during the reset phase and which input an offset voltage to signal lines during the readout phase.

The novel readout architecture presented herein provides a means to efficiently share a single amplifier between two readout channels of a CMOS image sensor, or similar device. The essence of the invention is the sharing of the amplifier by the two channels on an alternating basis. In a first phase, a first channel is reading out stored pixel signals to a differential amplifier, and the amplifier outputs are read by a differential signal to its corresponding ADC, the second channel is disconnected from the amplifier and the components in its readout path are reset. The channel modes are then switched, with the first channel taken off line and its readout components being reset, while the second channel pixels are read out.

The circuits of the invention comprises two readout channels. Each channel provides a pathway for Sample and Reset signals to reach an inverting amplifier, and a pathway for amplifier outputs to reach an ADC. In the simplest configuration, the charge readout system is under two alternating control phases. In each phase, one of the two readout paths, Channel 1 or Channel 2, is activated for readout, while the other is taken offline and its components are reset.

The circuit operates as follows. When a channel is activated for readout, a shift register or other column select logic device selects a single column from the active channel for readout. Switches are closed such that the column's Sample (photointegration) and Reset signals, stored on sample-and-hold (or equivalent components), are routed to the inverting amplifier. The amplified, inverted Sample and Reset signals are output as differential voltage signals from the amplifier by subtracting the two voltages. This subtraction also performs the CDS operation which removes the pixel offset and suppresses the low frequency noise. Each of these voltage signals is subsequently input to a differential ADC for conversion to a digital signal, which is exported from the ADC for further processing or storage.

A number of switches are located throughout each readout path of Channel 1 and Channel 2. The switches can be opened and closed to connect and disconnect the various components in the two phase operation of the circuit. When the appropriate combination of switches is opened or closed, one channel will be in readout mode while the other channel will be in a reset mode, where it is taken off line and its components reset.

When a channel is in readout mode, the various switches are switched such that:
  stored Sample and Reset signals from a selected column are connected to their respective amplifier input pathways;
  the Sample and Reset signals each move to a feedback capacitor of the switched capacitor amplifier, which are connected to the inputs on the amplifier;
  the input signals are inverted and amplified by the amplifier;
  the amplifier outputs are connected to the channel's ADC; and
  each output of the amplifier is also fed back to its respective input across the respective feedback capacitor.

When the channel is reset mode, the various switches are switched such that:
  no stored column signals are fed to the amplifier input pathways;
  the feedback capacitors storing the Sample signal and Reset signal are disconnected from their respective amplifier inputs, the feedback loops for each the Sample signal and the Reset signal are disconnected from the amplifier outputs, and the channel's ADC is disconnected from the amplifier outputs, so that the amplifier is fully isolated from the channel and may be utilized by the opposing channel;
  that channel's feedback capacitors are drained of charge to reset them for the next read cycle or optionally may be connected to voltage sources, such as common mode voltage sources, or ground in order to clear charge from the feedback capacitors or to set them to a desired reset level; and
  the Sample and Reset pathways may connected and shorted, and may be driven to the device's reset voltage (for example, a common mode voltage) by connecting them to a voltage source or ground, to clear charge from and reset the amplifier input pathway for the next read cycle.

In one optional implementation of the invention, an offset voltage is input to the readout circuit by a charged level-shifting capacitor connected to each readout path. This configuration allows conversion the two single ended photointegration and reset voltages into a fully differential signal. The voltage sources used to charge the level-shifting capacitors may be fixed voltage sources or variable voltage sources, for example sources under the control of elements that can sense signal strength and can be adjusted automatically to boost signal to a desired degree to impart optimal balance or magnitude.

In one implementation, the level shifting functions of the invention are performed utilizing a novel configuration wherein the feedback capacitor on each line also serves as the level shifting capacitor. This configuration advantageously reduces the number of capacitors in the circuit by 50%, saving space and reducing power consumption. This technique is described in more detail in co-pending U.S. patent application Ser. No. 14/875,511, entitled, "Fully Differential Output Swing for Analog Array Based Charge Mode Readout used in a CMOS Image Sensor," filed Oct. 5, 2015 and incorporated herein by reference in its entirety. An exemplary circuit illustrating this implementation is described in FIG. 2.

The operation of the invention will next be described by reference to FIG. 1, which depicts an exemplary implementation of the invention. The system depicted in FIG. 1 comprises two separate channels, Channel 1 and Channel 2. Each channel comprises an array of sample and hold capacitor pairs. In FIG. 1, Channels 1 and 2 comprises three pairs of sample and hold capacitors, although it will be understood that any number of pairs may be present in a channel, for example 16, 32, or 64 pairs may be present. In FIG. 1. Channel 1 comprises sample and hold capacitor pair 1*a* (101 and 102), pair 1*b* (103 and 104), and pair 1*c* (105 and 106). Channel 2 comprises capacitor pair 2*a* (109 and 110), 2*b* (111 and 112) and 2*c* (113 and 114). Each capacitor pair is connected to column output lines (not shown) from selected pixels in an image sensor pixel array, such that photointegration signals and reset signals from selected pixels can be read from the pixels and stored on the sample and hold pairs during pixel readout. In pixel pairs 1*a*, 1*b*, and 1*c*, for example, one capacitor in each pair stores a photointegration signal (e.g. 101, 103, 104) and one capacitor in each pair stores a reset signal (e.g. 102, 104, 106).

Readout is performed in two alternating phases, wherein one channel is read out during the first phase and the other channel is reset during this first phase. In the second phase, the first channel is reset and the second channel is read out. The sample and hold capacitor pairs are thus read out in a sequential manner, with a first pair from Channel 1 read out, then the first pair from Channel 2 read out, followed by the second pair of Channel 1, then the second pair of Channel 2, and so on until all pairs in both channels have been read out, at which point the cycle is repeated. For example, a readout sequence for the system depicted in FIG. 1 could be: 1*a*, 2*a*, 1*b*, 2*b*, 3*a*, 3*b*.

For example, in an exemplary operation, in a first phase, Channel 1 depicted in FIG. 1 is read out. Switches 117 and 118 are closed to connect each sample and hold capacitor pair array in Channel 1 to an input of the amplifier 122. To read out sample and hold capacitor pair 1*a*, for example, switches 107 and 108 are closed. Signals stored on these capacitors are then read by the amplifier in feedback loops across capacitors 129 and 130. The feedback loop across capacitor 129 is created by closing switches 131 and 133. The feedback loop across capacitor 130 is created by closing switches 132 and 134. Amplifier outputs are connected to an ADC dedicated to Channel 1 (123) by closing switches 125 and 126. The connection of the ADC to the amplifier may be delayed for a short period such that the amplifier has time to settle before amplifier output is sampled by the ADC. Digital signals from the ADC may be output on one or more lines to storage or processing elements.

During the readout phase of Channel 1, Channel 2 components are off line from the amplifier. Switches 119 and 120 are open, such that the array of sample and hold capacitor pairs in Channel 2 are isolated from the amplifier. Switches 139 and 141 and 140 and 142 are open, such that Channel 2 feedback capacitors 137 and 138 are disconnected from the amplifier. Switches 127 and 128 are open so that the Channel 2 ADC 124 is disconnected from the amplifier outputs. During this phase, switches 161 and 162 are closed, which connects the capacitor plates of feedback capacitor 137 and capacitor plates of feedback capacitors 138 to themselves, clearing charge from the capacitor. In the circuit of FIG. 1, capacitors 137 and 138 and their readout paths are also connected together in the first phase by closing switch 144. Optional circuitry may be included (not shown) to clear read paths of charge by hooking them to a common mode voltage, another voltage source, or ground.

Upon the completion of first readout phase, wherein the selected pair of sample and hold capacitors from Channel 1 is read out, the system switches to a second phase, where it is configured such that a selected pair of sample and hold capacitors from Channel 2 can be read out and the components of Channel 1 are reset.

In this second phase, Channel 1 readout components are taken off line. Switches 117 and 118 are open, such that the array of sample and hold capacitor pairs in Channel 1 is isolated from the amplifier. Switches 131 and 133 and 132 and 134 are open, such that Channel 1 feedback capacitors 129 and 130 are disconnected from the amplifier. Switches 135 and 136 are closed, such that capacitors 129 and 130 are shorted to themselves. Optionally, the two feedback capacitors 129 can also be shorted to each other by a connecting line, for example by closing switch 143. Switches 125 and 126 are opened, disconnecting the amplifier from the Channel 1 ADC 123.

In this second phase, Channel 2 is placed on-line to the amplifier. Switches 119 and 120 are closed such that a selected pair of sample and hold capacitors from the array of Channel 2 can be connected to the amplifier. If, for example, the sample and hold capacitor pair comprising 109 and 110 is to be read out, switches 115 and 116 may be closed to transfer the charges stored on 109 and 110 to the readout circuit. Switches 139 and 141 are closed to create a feedback loop across capacitor 137 and switches 140 and 142 are closed to create a feedback loop across capacitor 138. Switches 127 and 128 are closed to connect the amplifier outputs to an ADC dedicated to Channel 2 (124).

The alternating operation of the readout configuration in FIG. 1 described herein demonstrates how a single amplifier can be used to alternately serve two separate channels wherein one channel is readout while the other channel is reset.

An exemplary amplifier of the circuits of the invention is a switched capacitor differential input-differential output op-amp amplifier. It will be understood that any type of differential amplifier and any type of ADC may be utilized in the practice of the invention so long as the combination performs the functions of calculating the differential between the Sample and Reset signals, performing CDS operation, and converting the differential to a digital signal for further processing or storage.

In one embodiment, the Sample signal is connected to the positive input of the amplifier, and the Reset signal is routed to the inverting input of the amplifier. In an alternative embodiment where for example a 3T pixel is used, the device can be configured in the opposite orientation with the Sample signal being routed to the inverting output and Reset signal routed to the positive input.

In one implementation of the invention, the alternating read-reset operations performed on two channels with a shared amplifier is further improved by the use of level shifting capacitors. Level shifting capacitors can level shift or modulate the signals in the charge readout stage. For example, fully differential output swing can be imparted to the amplifier outputs by injecting differential offset voltages to the opposing amplifier inputs.

In the alternating phases of operation, during a channel's reset phase, the level shifting capacitors of that channel are charged to a desired level and during that channel's readout phase, the capacitors inject an offset voltage to the signal lines. For example, an exemplary implementation of level shifting is depicted in FIG. 1. Here, a pair of level shifting capacitors is present in each line of the readout path. Channel 1 is served by level shifting capacitors 145 and 146 and Channel 2 is served by level shifting capacitors 153 and 154. During the Channel 1 reset phase, capacitors 145 and 146 are charged. Capacitor 145 is charged by closing switch 147, connecting it to voltage source 149. Capacitor 146 is charged by closing switch 148, connecting it to voltage source 150. In the subsequent operation phase where Channel 1 is read out, switches 147 and 148 are open to disconnect the capacitors from the voltage sources while switches 151 and 152 are closed such that the stored charge on each capacitor injects an offset voltage to the signal paths. Channel 2 is operated in the opposite timing scheme, wherein, during the Channel 1 readout phase, Channel 2 level shifting capacitors 153 and 154 are isolated from the signal paths by opening switches 159 and 160 and are charged by voltage sources 155 and 156 by closing switches 157 and 158. In the subsequent Channel 2 readout phase, capacitors 153 and 154 are disconnected from the voltage sources by opening switches 157 and 158 and are connected to the signal paths by closing switches 159 and 160.

Figure 2:
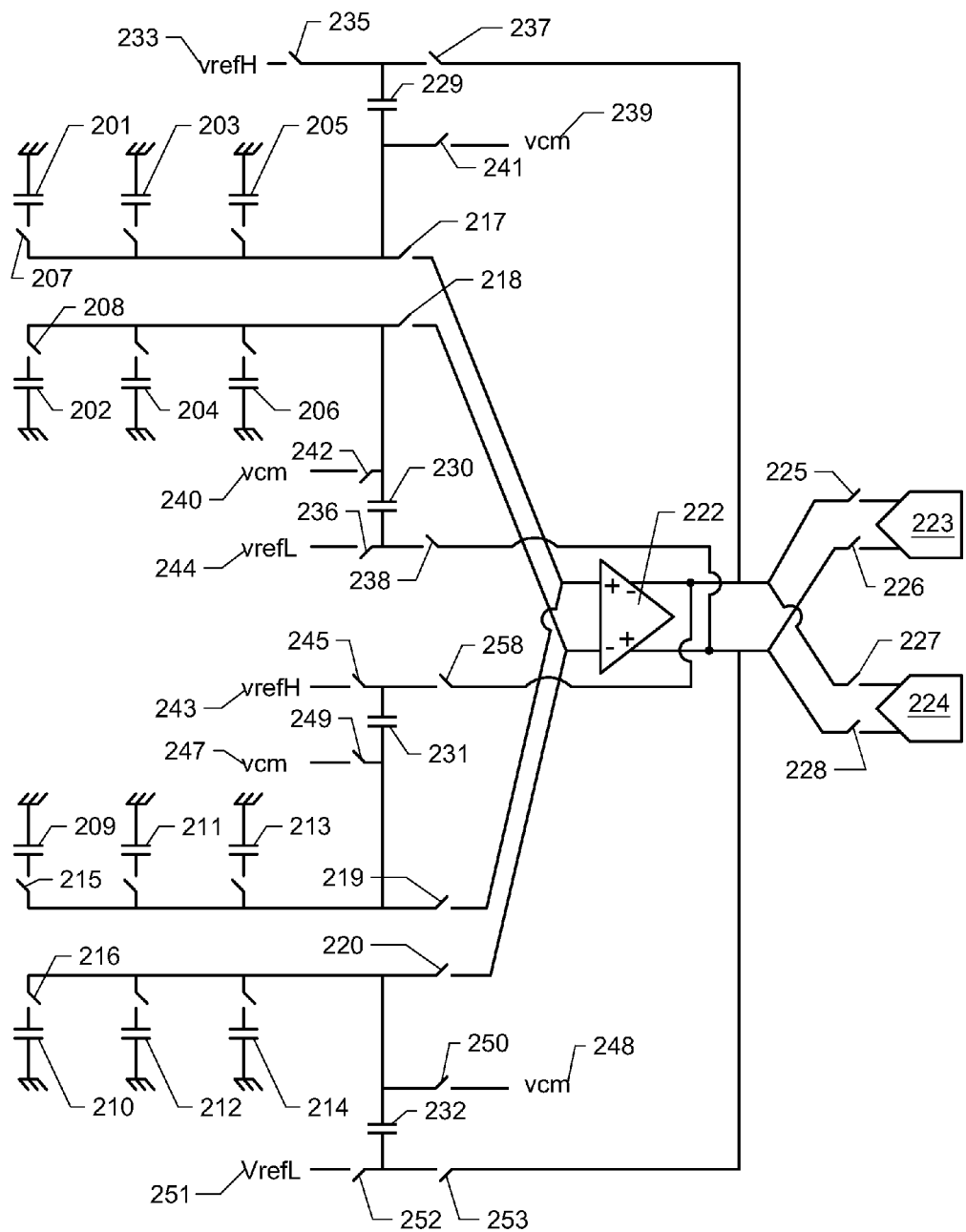
FIG. 2 depicts a alternative implementation of the invention wherein each capacitor serves two roles, acting as a level shifting capacitor and as a feedback capacitor.

In an alternative configuration of the level shifting implementation, a single pair of capacitors may serve to inject offset voltages and to create feedback loops with the amplifier. FIG. 2 depicts such a configuration. Here, two channels comprising an array of sample and hold capacitor pairs are present. Channel 1 comprises sample and hold capacitor pairs 201 and 202, 203 and 204, 205 and 206. It will be understood that any number of capacitor pairs may be present in the arrays. The readout configuration depicted in FIG. 2 is read in two alternating phases, wherein during a first phase, a pair of sample and hold capacitors from the first channel is read while the readout components of the second channel are reset, followed by a second phase wherein the readout components of the first channel are reset while a selected pair of sample and hold capacitors from the second channel is read out.

In the phase where Channel 1 is read out, the sample and hold capacitor pair comprising capacitors 201 and 202 may be read out as follows. Switches 207 and 208 are closed and switches 217 and 218 are closed, connecting each sample and hold capacitor to the input line of the amplifier 222. Closing of switch 237 creates a feedback loop across capacitor 229 on the first amplifier input and output line and closing of switch 238 creates a feedback loop across capacitor 230 on the second amplifier input and output lines. Closing of switches 225 and 226 connects the two amplifier outputs to an ADC 223 dedicated to Channel 1. The capacitors 229 and 230 have been previously charged a desired level in the previous phase of operation, such that this charge injects an offset voltage to the circuit. Thus, capacitors 229 and 230 play a dual role during the readout phase of providing feedback to modulate the gain of the amplifier and of level shifting, boosting, or otherwise offsetting amplifier output by injecting a voltage signal onto the amplifier lines.

During this first phase, the readout components of Channel 2 are taken offline. Switches 219 and 220 are open, as are switches 253 and 260, isolating capacitors 231 and 232 from the amplifier. Switches 227 and 228 are open so that the Channel 2 ADC 224 is disconnected from the amplifier outputs. During this phase, Channel 1 capacitors 231 and 232 are charged by connecting them to voltage sources. Switches 245 and 249 are closed, connecting capacitor 231 to voltage sources 243 and 247. Switches 250 and 252 are closed, connecting capacitor 232 to voltage sources 251 and 248. The voltage sources may comprise, for example a high or positive reference voltage and a low or negative reference voltage being applied to one each of the separate capacitors on a first plate and a common mode voltage applied to each of the capacitors on a second plate.

In the next phase, Channel 1 read components are taken offline and reset and Channel 2 components are read out.

The timing of the switching regime is not limited to any specific configuration. In one embodiment, the switches of the shared amplifier circuit are under the control of two clocks in substantially alternating high and low phases. For example, the readout circuit of FIG. 1 or FIG. 2 can be controlled by two clocks, P1 (301) and P2 (302), alternately cycling high and low, as depicted in FIG. 3.

An exemplary timing regime for the system of FIG. 1 is as follows. Switches 117 and 118 (connecting the sample and hold capacitor array of Channel 1 to the readout circuitry); 131 and 133 and 132 and 134 (creating Channel 1 amplifier feedback loops across capacitors 129 and 130); 125 and 126 (connecting amplifier output to the Channel 1 ADC 123); and 161 and 162 and 144 (shorting and resetting the feedback capacitors of Channel 2) are controlled by Clock P1 and are closed when P1 is high and are opened when P1 is low. If level shifting is utilized, switches 151 and 152 (which connect each of the Channel 1 level shifting capacitors to one of the amplifier input lines); and 157 and 158 (which connect each of Channel 2 level shifting capacitors to a separate reference voltage source) are controlled by Clock P1 and are closed when P1 is high and are opened when P1 is low.

In this exemplary timing regime, 119 and 120 (connecting the sample and hold capacitor array of Channel 2 to the readout circuitry); 139 and 141 and 140 and 142 (creating Channel 2 amplifier feedback loops across capacitors 137 and 138); 127 and 128 (connecting amplifier output to the Channel 2 ADC 124); and 125 and 136 and 143 (shorting and resetting the feedback capacitors of Channel 1) are controlled by Clock P2 and are closed when P2 is high and are opened when P2 is low. If level shifting is utilized, switches 159 and 160 (which connect Channel 2 level shifting capacitors each to one of the amplifier input lines); and 147 and 148 (which connect each of Channel 1 level shifting capacitors to a separate reference voltage source) are controlled by Clock P2 and are closed when P2 is high and are opened when P2 is low.

Figure 3:
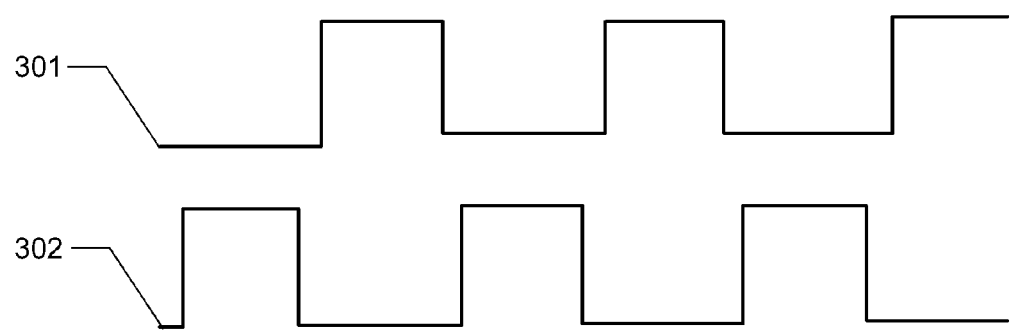
FIG. 3 depicts an exemplary timing diagram for the control elements of the two channels in the dual channel shared amplifier designs of the invention.

The circuit of FIG. 2 can also be controlled by the timing regime of FIG. 3, under the control of clocks P1 and P2 which alternate in opposite high and low phases. In the circuit of FIG. 2: switches 217 and 237 (which create a feedback loop for the first amplifier input and output across capacitor 229); switches 218 and 238 (which create a feedback loop for the second amplifier input and output across capacitor 230); switches 225 and 226 (which connect the amplifier outputs to the ADC dedicated to Channel 1); and switches 245 and 249 (which connect Channel 2 capacitor 231 to voltage sources for charging) and 250 and 252 (which connect Channel 2 capacitor 232 to voltage sources for charging) are under control of Clock P1 and are closed when P1 is high and are open when P1 is low.

In this exemplary timing regime for FIG. 2: switches 219 and 258 (which create a feedback loop for the first amplifier input and output across capacitor 231); switches 220 and 253 (which create a feedback loop for the second amplifier input and output across capacitor 232); switches 227 and 228 (which connect the amplifier outputs to the ADC 224 dedicated to Channel 2); and switches 235 and 241 (which connect Channel 1 capacitor 229 to voltage sources for charging) and 242 and 236 (which connect Channel 2 capacitor 230 to voltage sources for charging) are under control of Clock P2 and are closed when P1 is high and are open when P1 is low.

In one embodiment, the transition between P1 high, P2 low and P2 high, P1 low is substantially instantaneous. In another embodiment, there is a short interval where both P1 and P2 are low, during which time all switches are opened, allowing settling of the system and avoiding signal spikes or crosstalk. In some embodiments, all switching takes place simultaneously at the transition between high and low phases. Alternatively, staggered switching may be utilized to improve circuit performance, for example to avoid spikes or crosstalk. Such staggered switching would necessitate additional control clocks and timing regimes, and is readily implemented by one of skill in the art.

The invention is not limited to any specific architecture, switching regime or control cycle. The invention encompasses any readout circuitry comprising two readout channels, wherein alternating readout of signals from each of the two channels to an ADC is performed through a shared amplifier. The invention also encompasses any readout architecture or timing regime which allows the use of two readout pathways converging on a single amplifier, such that when one readout pathway is in use, the other is disconnected from the amplifier, and further, wherein any reset operations necessary for the readout pathway to work effectively are performed when the pathway is disconnected from the amplifier.

For convenience, the invention has been described with respect to the readout of two channels in a CMOS image sensor array. However, it will be understood that the invention is not limited to use in CMOS image sensor arrays, and may be implemented in any device to achieve readout of multiple channels via a shared amplifier. Additionally, it will be understood that the readout circuits and associated methods of the invention are not limited to CMOS image sensors and may be implemented in any device, including other types of image sensors and non-image sensors, wherein multiple data signals are read out using an amplifier. Lastly, it will be understood that the invention encompasses architectures in which any number of channels converge on a shared amplifier, for example, three-channel and four-channel readout architectures may be employed.

All patents, patent applications, and publications cited in this specification are herein incorporated by reference to the same extent as if each independent patent application, or publication was specifically and individually indicated to be incorporated by reference. The disclosed embodiments are presented for purposes of illustration and not limitation. While the invention has been described with reference to the described embodiments thereof, it will be appreciated by those of skill in the art that modifications can be made to the structure and elements of the invention without departing from the spirit and scope of the invention as a whole.

What is claimed is:
1. A readout circuit comprising
a fully differential amplifier comprising a first input and a corresponding first output; and a second input and a corresponding second output;
two readout channels, each readout channel comprising a plurality of sample and hold capacitor pairs, each comprising a first and second sample and hold capacitor;

a feedback capacitor pair comprising a first and a second capacitor;

an analog to digital converter, comprising a first and a second input; and switches and connection lines configured such that:

signals from a selected sample and hold capacitor pair can be connected to or disconnected from the inputs of the amplifier, wherein the first sample and hold capacitor of the pair can be connected to or disconnected from the first amplifier input and the second sample and hold capacitor of the pair can be connected to or disconnected from the second amplifier input;

the first output of the amplifier can be connected to and disconnected from the first input of the amplifier across the first feedback capacitor;

the second output of the amplifier can be connected to and disconnected from the second input of the amplifier across the second feedback capacitor;

the first amplifier output can be connected to or disconnected from the first analog to digital converter input;

the second amplifier output can be connected to or disconnected from the second analog to digital converter input;

the two plates of the first feedback capacitor can be connected to short the capacitor and can be disconnected from each other; and the two plates of the second feedback capacitor can be connected to short the capacitor and can be disconnected from each other.

2. The readout circuit of claim 1, wherein each channel further comprises a pair of level shifting capacitors comprising a first and a second level-shifting capacitor; and switches and connection lines configured such that one plate of the first level shifting capacitor can be connected to or disconnected from the first input of the amplifier and one plate of the second level shifting capacitor can be connected to or disconnected from the second input of the amplifier; and one plate of the first level shifting capacitor can be connected to or disconnected from a voltage source and one plate of the second level shifting capacitor can be connected to or disconnected from a voltage source.

3. The readout circuit of claim 1, wherein each channel further comprises, switches and connection lines configured such that: each plate of the first feedback capacitor can be connected to or disconnected from a separate voltage source and each plate of the second feedback capacitor can be connected to or disconnected from a separate voltage source.

4. The readout circuit of claim 1, wherein each sample and hold capacitors pair stores a photointegration signal and a reset signal received from a pixel in an image sensor array.

5. A method of performing charge mode readout of a plurality of stored signal pairs using a two channel readout circuit having an amplifier, said amplifier having a first input and corresponding first output and second input and corresponding second output; wherein the readout is performed in alternating phases by changing the configuration of switches and connections of the circuit, wherein:

during the first phase, the connections and switches of the readout circuit are configured such that: a first stored signal is connected to the first input of the amplifier and a second stored signal is connected to the second input of the amplifier, wherein the first amplifier output is fed back across a first feedback capacitor and the second amplifier output is fed back across the second feedback capacitor; and the first and second amplifier outputs are connected to the separate inputs of a first analog to digital converter; the plates of a third capacitor are connected to each other to clear charge from the third capacitor; the plates of a fourth capacitor are connected to each other to clear charge from the fourth capacitor, and wherein the third and fourth capacitors are not connected to the amplifier during this first phase;

and in a second phase, the connections and switches of the readout circuit are configured such that: the first and second feedback capacitors are disconnected from the amplifier; the plates of the first capacitor are connected to each other to clear charge from the first capacitor; the plates of the second capacitor are connected to each other to clear charge from the second capacitor; a third stored signal is connected to the first input of the fully differential amplifier and a fourth stored signal is connected to the second input of the fully differential amplifier, wherein the first amplifier output is fed back across the third feedback capacitor and the second amplifier output is fed back across the fourth feedback capacitor; and the first and second amplifier outputs are connected to the separate inputs of a second analog to digital converter.

6. The method of claim 5, wherein during the first phase the configuration of switches and connections is such that: one plate of a first level shifting capacitor is connected to the first amplifier input and one plate of a second level shifting capacitor is connected to the second amplifier input; one or both plates of a third level shifting capacitor are connected to a voltage source and one or both plates of a fourth level shifting capacitor are connected to a voltage source; and neither the third or fourth level shifting capacitor is connected to the amplifier; and during the second phase the configuration of switches and connections is such that: one plate of the third level shifting capacitor is connected to the first amplifier input and one plate of the fourth level shifting capacitor is connected to the second amplifier input; one or both plates of the first level shifting capacitor are connected to a voltage source and one or both plates of the second level shifting capacitor are connected to a voltage source; and neither the first or second level shifting capacitor is connected to the amplifier.

7. The method of claim 5, wherein during the first phase the configuration of switches and connections is such that: both plates of the third feedback capacitor are connected to separate voltage sources and both plates of the fourth feedback capacitor are connected to separate voltage sources; and during the second phase the configuration of switches and connections is such that: both plates of the first feedback capacitor are connected to separate voltage sources and both plates of the second feedback capacitor are connected to separate voltage sources.

8. The method of claim 5, wherein each pair of the plurality of stored signal pairs comprises a photointegration and a reset signal output from a pixel in an image sensor.

* * * * *